United States Patent
Zhang et al.

(10) Patent No.: US 9,865,790 B2
(45) Date of Patent: Jan. 9, 2018

(54) NANOSTRUCTURED BULK THERMOELECTRIC MATERIAL

(75) Inventors: Minjuan Zhang, Ann Arbor, MI (US); Yunfeng Lu, New Orleans, LA (US)

(73) Assignees: Toyota Motor Engineering & Manufacturing North America, Inc., Erlanger, KY (US); The Administrators of the Tulane Educational Fund, New Orleans, LA (US)

(*) Notice: Subject to any disclaimer, the term of this patent is extended or adjusted under 35 U.S.C. 154(b) by 1765 days.

(21) Appl. No.: 11/933,584

(22) Filed: Nov. 1, 2007

(65) Prior Publication Data

US 2008/0173344 A1 Jul. 24, 2008

Related U.S. Application Data

(63) Continuation-in-part of application No. 11/120,731, filed on May 3, 2005, now Pat. No. 7,309,830.

(60) Provisional application No. 60/633,918, filed on Dec. 7, 2004.

(51) Int. Cl.
| | | |
|---|---|---|
| H01L 35/16 | (2006.01) |
| H01L 35/18 | (2006.01) |
| H01L 35/12 | (2006.01) |
| H01L 35/22 | (2006.01) |
| H01L 35/14 | (2006.01) |
| H01L 35/02 | (2006.01) |
| H01L 35/26 | (2006.01) |
| H01L 35/34 | (2006.01) |

(52) U.S. Cl.
CPC .............. *H01L 35/16* (2013.01); *H01L 35/02* (2013.01); *H01L 35/12* (2013.01); *H01L 35/14* (2013.01); *H01L 35/18* (2013.01); *H01L 35/22* (2013.01); *H01L 35/26* (2013.01); *H01L 35/34* (2013.01)

(58) Field of Classification Search
CPC .......... H01L 35/16; H01L 35/26; H01L 35/34; H01L 35/02; H01L 35/12; H01L 35/14; H01L 35/18; H01L 35/22; H01L 37/00
USPC ........................................ 136/200, 238–240
See application file for complete search history.

(56) References Cited

U.S. PATENT DOCUMENTS

| | | | | |
|---|---|---|---|---|
| 3,859,143 A | * | 1/1975 | Krebs ........................... | 136/205 |
| 5,108,515 A | * | 4/1992 | Ohta et al. ..................... | 136/201 |
| 5,886,390 A | * | 3/1999 | Nishimoto et al. ........... | 257/467 |
| 7,309,830 B2 | | 12/2007 | Zhang et al. | |
| 2002/0170590 A1 | | 11/2002 | Heremans et al. | |
| 2003/0039744 A1 | | 2/2003 | Fan et al. | |

(Continued)

FOREIGN PATENT DOCUMENTS

JP         10242535 A   *   9/1998

OTHER PUBLICATIONS

English machine translation of JP 10-242535A.*
E. M. Conwell. "Properties of Silicon and Germanium: II". 1958. Proceedings of the IRE. 1281-1300.*

*Primary Examiner* — Lindsey Bernier
(74) *Attorney, Agent, or Firm* — Dinsmore & Shohl LLP

(57) ABSTRACT

A thermoelectric material includes a composite having a first electrically conducting component and second low thermal conductivity component. The first component may include a semiconductor and the second component may include an inorganic oxide. The thermoelectric composite includes a network of the first component having nanoparticles of the second component dispersed in the network.

10 Claims, 16 Drawing Sheets

(56) References Cited

U.S. PATENT DOCUMENTS

2003/0047204 A1     3/2003   Fleurial et al.
2006/0102224 A1*   5/2006   Chen et al. .................. 136/203

* cited by examiner

$Bi_2Te_3$–$SiO_2$ nanocomposite

NANOSTRUCTURED BULK THERMOELECTRIC MATERIAL

REFERENCE TO RELATED APPLICATION

This application claims priority to U.S. Provisional Patent Application U.S. Ser. No. 60/633,918, filed Dec. 7, 2004, the entire content of which is incorporated herein by reference.

FIELD OF THE INVENTION

This invention relates to materials having thermoelectric properties and to thermoelectric devices.

BACKGROUND OF THE INVENTION

A thermoelectric device can be used to obtain electrical energy from a thermal gradient (for example, a thermoelectric generator using the Seebeck effect), or to generate a thermal gradient from electrical energy (for example, a thermoelectric refrigerator using the Peltier effect). The discussion below is directed to the Seebeck effect, but the general concepts also apply to applications of the Peltier effect.

A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_h-T_C)$. Since Z varies with temperature, a useful dimensionless figure-of-merit can be defined as ZT.

By the end of the 1950s, the best bulk thermoelectric materials were found to be alloys of bismuth telluride and antimony, which gave a room temperature ZT~1. Workers in the thermoelectric field have been attempting to improve the figure of merit over the past 40 years without much success. Increasing ZT is difficult because the three parameters S, $\sigma$, and $\kappa$ are all related to the free carrier concentration and are usually not independent. For example, doping typically increases the semiconductor's electrical conductivity, but decreases its Seebeck coefficient and increases the thermal conductivity. Efforts to reduce the lattice thermal conductivity by alloying also reduce the electrical conductivity by providing an extra scattering mechanism.

Dresselhaus and coworkers at MIT theoretically demonstrated that quantum confinement of electrons and phonons within nanowires of a thermoelectric material can increase the value of ZT. 1-D nanowires in particular could reach ZT≈2-5 if the nanowire diameter lies in the range of 5-10 nm. Certain structures have been investigated, for example such as described in Heremans, J. P. et al., "Thermoelectric Power of Bismuth Nanocomposites"; Phys. Rev. Lett.; 2002, 88, 216801; Venkatasubramanian, R. et al., "Thin-film thermoelectric devices with high room temperature figures of merit"; Nature; 2001, 413, 597-602; Harman, T. C. et al., "Thermoelectric quantum dot superlattices with high ZT"; Electron. Mater.; 2000, 29, L1-L4; Rabin, O. et al., "Anomalously high thermoelectric figure of merit in $Bi_{1-x}Sb_x$ nanowires by carrier pocket alignment"; APL; 2001, 79, 81-83; and Dresselhaus, M. S. et al., "Low-dimensional thermoelectric materials"; PSS; 1999, 41, 679-682. However, these approaches do not provide a simple approach to making large-scale, low-cost thermoelectric devices. Conventional semiconductor device fabrication methods are unsuitable for manufacturing bulk samples, and are often expensive.

In automobiles, about 70 percent of energy derived from fuel is lost to waste heat and engine cooling. Only a small proportion of energy provided by fuel combustion is used, and a large amount of thermal energy is thrown away. Recovery of waste thermal energy is a big challenge in automotive industries due to the increasing energy crisis. Thermoelectric conversion of thermal energy to electrical energy could be an effective way to obtain electrical energy from otherwise wasted heat production. However, direct thermal to electric conversion (DTEC) technology currently faces two major challenges: low conversion efficiency and insufficient power density. Hence, improved materials and devices having high thermoelectric conversion efficiency are urgently required.

SUMMARY OF THE INVENTION

A thermoelectric composite material comprises two or more components, at least one of which is a thermoelectric material. The thermoelectric composite has a nanoscale structure that enhances the figure of merit of the thermoelectric component.

In one example, the thermoelectric composite may include a first component and a second component. The second component may have an electrical conductivity substantially less than the first component and a melting temperature greater than the first component. The thermoelectric material may include a network of the first component having nanoparticles of the second component dispersed in the network.

In another aspect, a process for forming a thermoelectric material includes providing a first component and a second component. The first and second components may be mixed to form a dispersed mixture. The dispersed mixture may be sintered at a temperature around the melting point of the first component to form a network of the first component having nanoparticles of the second component dispersed in the network. The first component may be a semiconducting material and the second component may be an inorganic oxide.

DETAILED DESCRIPTION OF THE INVENTION

Figure 1:
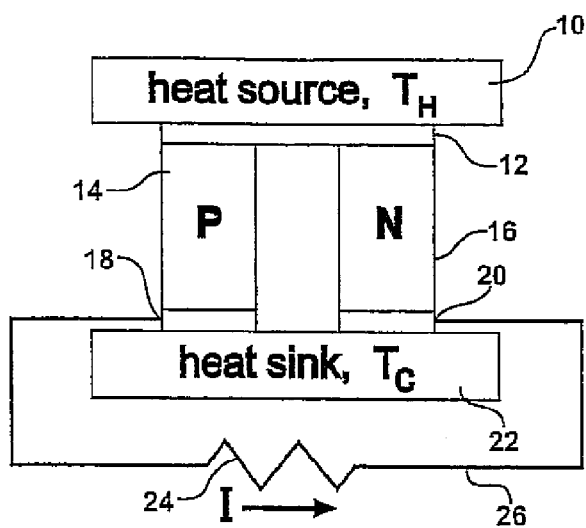
FIG. 1 is a schematic of a thermoelectric unicouple operated in power generation mode, where $T_H$ and $T_C$ represent the hot wall and cold wall temperatures, respectively.

Examples of the present invention include thermoelectric materials with high figures of merit, which can be used in thermoelectric devices having high conversion efficiency.

An example thermoelectric material according to the present invention is a composite material including a first component and a second component. The first component can be a semiconductor or other electrical conductor, and is nanostructured so that quantum confinement effects modify the properties of the first component. Examples of the first component include any conventional bulk thermoelectric material (that is, a material which has appreciable thermoelectric properties in bulk). The material may be chosen based on the desired operating temperature range required. Materials which could be chosen for the first component include bismuth telluride and its alloys, bismuth-antimony compounds (which may be referred to as bismuth-antimony alloys or bismuth telluride), lead telluride (PbTe), TAGS (alloys of the form $(TeGe)_{1-x}(AgSbTe)_x$, where x~0.2, silicon germanium alloys (SiGe), and skutterudite materials such as $LaFe_3CoSb_{12}$ and $CeFe_3CoSb_{12}$. The first component may be any semiconducting selenide or telluride. Other materials are discussed elsewhere.

For example, the first component may be an alloy of bismuth telluride and antimony, or other material having a dimensionless figure of merit ZT~1 in bulk. The second component preferably has a low value of thermal conductivity, and can, for example, be an electrical insulator or poor electrical conductor. The second component need not be a thermoelectric material, in that a bulk sample of the second material need not show a useful (or even appreciable) thermoelectric effect in a bulk sample. The second component can also be referred to as a matrix material, or matrix, in the examples below.

The combination, or composite, of the two components can provide an improved thermoelectric figure of merit, compared with the figure of merit of a bulk sample of the first component, due to the combination of a low thermal conductivity, high electrical conductivity and high Seebeck coefficient. The thermal conductivity of the composite can be lower than that of a bulk sample of the first component due to the presence and lower thermal conductivity of the matrix material. Quantum confinement effects due to the structure of the first component can further increase the figure of merit of the composite thermoelectric material.

For example, the first component can be a nanostructured network. The nanostructured network may comprise nanowires, for example in an interconnected network including nanowires. The interconnected network can be three dimensional. Examples include a nanostructured bulk thermoelectric material comprising hexagonal or cubic semiconductor nanowire or nanomesh arrays within a ceramic matrix.

The nanostructure may also include nanoparticles, or other structures having a feature size (such as nanowire or nanoparticle diameter) in the nanometer (or nanoscale) range, for example, approximately 0.5-1000 nm, for example in the range 2-20 nm. All ranges are inclusive of given limits. The terms mesoscale, mesopore, mesoporous and the like, as used in this specification, refer to structures having feature sizes in the range 5 nm-100 nm. No particular spatial organization or method of manufacture is implied by the term mesoscale as used here. Hence, a mesoporous material includes pores, which may be ordered or randomly distributed, having a diameter in the range 5 nm-100 nm, whereas a nanoporous material includes pores having a diameter in the range 0.5-1000 nm.

In other examples, the first component is provided as nanoparticles, or particles including nanostructures of the first component. Examples include composites formed from semiconductor and ceramic particles, for example by hot pressing of a mixture of ceramic particles and semiconductor nanoparticles.

Examples of the present invention include a network of semiconductor nanostructures in a matrix material, the matrix material having a low value of thermal conductivity. The matrix material can be an electrically insulating material, such as a ceramic, or other electrically insulating material.

Thermoelectric materials according to the present invention can be thick films or bulk materials having a smallest physical dimension greater than conventional thin films, for example greater than 0.1 mm, such as 1 mm or greater. The electrical conductivity of the first component can over 100 times greater than the electrical conductivity of the second component, and may be many orders of magnitudes greater. The electrically conducting nanostructured network can be a three-dimensional continuous network so that the network is continuous in three dimensions.

A nanostructured thermoelectric material according to the present invention may have a high electrical conductivity ($\sigma$) due to the network structure of semiconductor (or other electrical conductor, such as metal) nanowires or nanomeshes, and a large value of Seebeck coefficient (S) because of the enhancement of the density of states near Fermi level with nanowire or nanomesh structure due to quantum confinement. The nanostructured thermoelectric material can also have a very low value of thermal conductivity κ, because of the low thermal conductivity of the matrix material, and also due to the increased boundary scattering of phonons due to the nanostructure. This provides a high dimensionless figure of merit, ZT.

As discussed previously, the figure of merit, Z, for a thermoelectric material can be defined as $Z=S^2\sigma/\kappa$, in terms of Seebeck coefficient (S), electrical conductivity (σ), and thermal conductivity (κ). Hence, a good thermoelectric material may have large values of S and σ, and/or low values of κ. High thermoelectric figures of merit (ZT>1) can be provided by low-dimensional semiconductor structures. The quantum size effect tunes the electronic and thermal properties and increases thermoelectric efficiency. However, preparation of quantum wires, quantum dots, superlattice structures, and the lice using conventional semiconductor device processing techniques requires complex and expensive fabrication techniques and equipment. In addition, these approaches conventionally provide only thin films of thermoelectric material.

The quantum size effect has two types of influences: (1) the confined dimensions can modify the electronic band structure and phonon dispersion relationship, resulting in discrete electronic density of states and reduced phonon group velocity (confinement effect); and (2) the high surface area and (sometimes) interface area present in low-dimensional structures introduces more boundary scatterings for both electrons and phonons (surface effect). One or both of these effects may be significant in materials according to the present invention.

Advantages offered by nanostructures and other low-dimensional structures can include: (1) altered densities of states near the Fermi energy level which increases the Seebeck coefficient, (2) increased phonon scattering at material boundaries reduce thermal conductivity, and (3) the opportunity to physically separate dopant impurities from the carrier channel. Nanostructured composites according to examples of the present invention allow these advantages to be combined, and in addition a low thermal conductivity can be provided by a matrix material such as a ceramic matrix.

Methods according to the present invention can be used to prepare thick film or bulk thermoelectric materials. Such bulk materials are thicker than a thin film prepared by conventional methods, which are conventionally in the range 10 to 100 microns. Methods according to the present invention allow large-scale, low-cost manufacture of thermoelectric materials and thermoelectric devices.

In examples below, the term "ceramic" is used to refer to inorganic, non-metallic materials, typically electrical insulators, including compounds formed between metallic and nonmetallic elements such as aluminum and oxygen (e.g. alumina, $Al_2O_3$), calcium and oxygen (e.g. calcium oxide, CaO). Ceramics also include compounds formed between silicon and nitrogen (e.g. silicon nitride, $Si_3N_4$), silicon and oxygen (silica, $SiO_2$), and silicon and carbon (e.g. silicon carbide), and the like. As used herein, the term ceramic can also refer to glasses. The term ceramic is not limited to materials formed by a firing process.

The term "ceramic" is used to refer to materials which can be used in various illustrative examples described herein, such as silica (silicon oxide) based matrix materials. However, it should be understood that other electrically insulating or low thermal conductivity materials can be used, such other oxides, nitrides, oxynitrides, carbides, silicides, borides, and the like.

As used herein, the term "electrical conductor" refers to electrically conducting materials such as metals, semimetals, and semiconductors. The term "semiconductor" as used here includes doped semiconductors.

For example, if $T_H=500°$ C. and $T_C=50°$ C., using a material with a conventional ZT=1 corresponds to an efficiency of only 8%. If ZT=3, the efficiency is approximately 17%, and if ZT=5, the efficiency is approximately 22%. For a superlattice nanowire, the theoretical ZT can be greater than 15.

Thermoelectric composites can be formed using particles including nanostructured semiconductor, such as semiconductor nanoparticles, or particles including a nanostructured semiconductor (such as semiconductor nanowires running through a ceramic material, or superlattice structures). The particles including a nanostructured semiconductor can optionally be combined with other particles (such as ceramic particles, and/or other semiconductor particles), and the particles pressed into a bulk material having a high value of ZT.

FIG. 1 illustrates a configuration of a thermoelectric device using an improved thermoelectric material according to an example of the present invention.

The device includes heat source 10, first electrically conducting layer 12, first thermoelectric material 14, second thermoelectric material 16, first electrical contact 18, second electrical contact 20, heat sink 22, and resistive load 24 connected to the thermoelectric device through electrical lead 26.

In this example, the first thermoelectric material includes an n-type semiconductor, and the second thermoelectric material includes a p-type semiconductor. When heat is provided by the heat source ($T_H > T_C$), current is generated in the direction shown in FIG. 1.

In other examples, an electrical potential can be applied between the first and second electrical contacts so as to generate a thermal gradient in the device.

In one example, the first thermoelectric material includes a nanostructured p-type semiconductor within a first electrically insulating matrix material, and the second thermoelectric material includes a nanostructured n-type semiconductor within a second electrically insulating matrix material. The first and second matrix materials can be the same or different.

Figure 2:
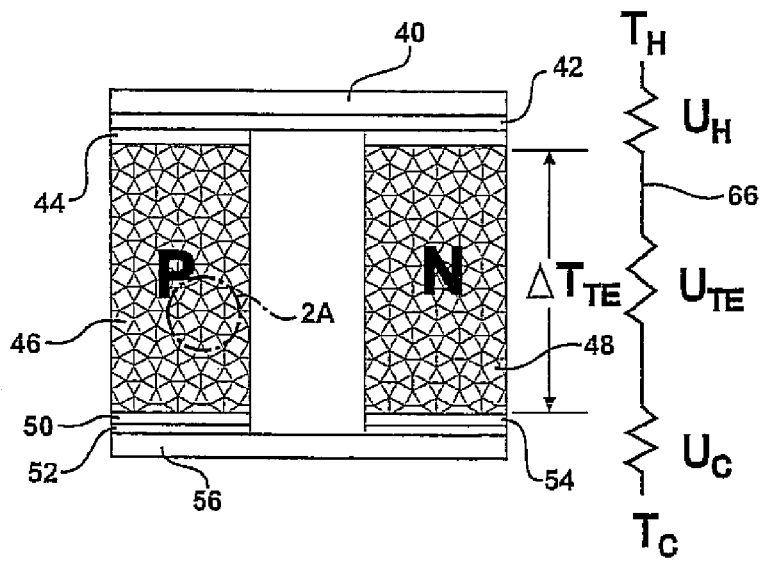
FIG. 2 shows a schematic of nanostructured material architectures used in a high efficiency thermoelectric device.

FIG. 2 shows one unicouple from a thermoelectric device. The device includes a first ceramic layer 40, which can be placed in thermal communication with a heat source, metal layer 42, first and second thermoelectric materials 46 and 48, having nickel electrical pads such as 44, first and second electrical contacts 52 and 54 respectively, and second ceramic layer 56, which can be placed in thermal communication with a heat sink.

A thermal circuit 66 corresponding to this unicouple contains the thermal resistances for the transfer of heat from the hot reservoir $U_H$, to the cold reservoir $U_C$, and through the thermoelectric legs $U_{TE}$. $U_{TE}=L/\sigma$ A where L is the length of the legs, A is the cross-sectional area and σ is the thermal conductivity. $U_H$ and $U_C$ contain the thermal resistance of the ceramic plate, as well as the coefficient of heat transfer from the hot side and to the cold reservoir.

Figure 2A:
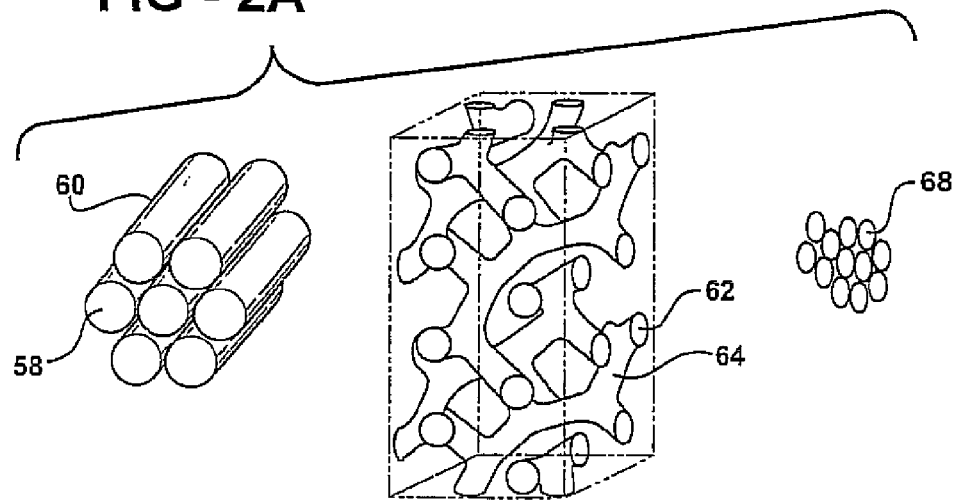
FIG. 2A shows a detail of possible nanostructured material architectures which can be used in the device of FIG. 2.

FIG. 2A illustrates possible structures for the first thermoelectric material. The thermoelectric material (i.e., first and/or second thermoelectric materials) may comprise p-type semiconductor nanowires 58 within a matrix material such as silica nanotubes 60. Alternatively, the thermoelectric material may comprise a p-type semiconductor nanomesh 62 within a matrix material 64. Alternatively, the thermoelectric material may comprise nanoparticles 68 of a semiconductor, optionally mixed with particles or nanoparticles of a ceramic material.

Example materials that can be used for semiconductor unicouples are listed in the Table 1. Deposition methods for these semiconductor materials are known in the art.

TABLE 1

Examples of semiconductors used for device fabrication.

| Approx. Temperature Range | n-type | p-type |
| --- | --- | --- |
| 300 K < T < 500 K | $Bi_2Te_3$—$Bi_2Se_3$ | $Bi_2Te_3$—$Sb_2Te_3$ |
| 500 K < T < 700 K | PbTe—SnTe doped with Bi | PbTe—SnTe |

Other semiconductors known in the art can be used, and appropriate dopants, also known in the art, can be used to obtain n- or p-type semiconductor materials as required. For example, semiconductors can include one or more elements from a group consisting of bismuth, tellurium, antimony, and tin. For example, an n-type material may be a halogen-doped bismuth-tellurium compound (also referred to as bismuth telluride).

Thermoelectric Material Fabrication

Various methods can be used to fabricate materials and devices according to the present invention, including 1) filling a porous matrix, such as a mesoporous silica ceramic matrix or porous monolith, with semiconductor using an electrochemical method; 2) hot-pressing a powder including ceramic/semiconductor nanocomposite particles (for example, particles having semiconductor nanowires running through a ceramic matrix) and 3) hot pressing a powder including a mixture of ceramic particles and semiconductor nanoparticles. The term 'powder' refers to a particulate material, including one or more types of particle. A porous monolith can be formed by hot pressing a ceramic powder. These approaches and others are described further below.

In example approaches, components for use in a thermoelectric composite can be mixed by ball milling, ultrasonication, or any mechanical mixing method. The mixing process may also modify the size distribution of each components, for example the ball milling can be used to generate nanoscale particles.

Components for mixing may be provided in the form of particles or materials that form particles during the mixing process, fibers, crystals, colloids, slurries, films (e.g. films that break up during mixing), or other form. Mixing can take place dry, or in a liquid, gel, or other medium. A thermal and/or vacuum step can be used to remove fluid components during or after mixing.

After mixing, the mixture is subjected to a consolidation process, which consolidates the loose powder into a monolithic form. The consolidation process may include application of pressure, temperature, and/or radiation to the mixture. Consolidation processes include hot isostatic pressing (HIP), hot uniaxial pressing, hot pressing, cold isostatic pressing, other pressing techniques, laser irradiation (e.g. laser sintering), microwave irradiation, irradiation by other electromagnetic radiation, ultrasound irradiation, shock compression or sintering, melting of one or more component (including softening or surface melting), electric field sintering, plasma sintering, or other technique or combination of techniques.

Other methods of forming a thermoelectric composite include providing a nanoporous first component, and filling pores of the first component with a second component. The first and/or the second component may be thermoelectric materials. The nanoporous material may be a foam, mesh, or other form.

The mixture may include a binding agent, for example as a third component that melts at a lower temperature than other components.

Mesoporous materials can be used as the matrix material. Mesoporous materials include pore arrays, such as nanopore arrays, and include anodized alumina, aluminosilicates, silica, and the like. In examples of the present invention, the semiconductor nanowires formed within a mesoporous material can be interconnected, for example in a cubic or other symmetry structure.

Electrodeposition of Semiconductor within Mesoporous Silica

The method of fabricating nanowire and nanomesh monoliths via electrodeposition using mesoporous silica monoliths as templates includes the following two steps: 1) fabrication of the silica template and 2) electrochemical growth of metal or semiconductor within the mesoporous channels of the templates. Mesoporous silica can be fabricated by various methods. The matrix material may also be any porous material, the pore structure including nanoscale features.

Figure 3:
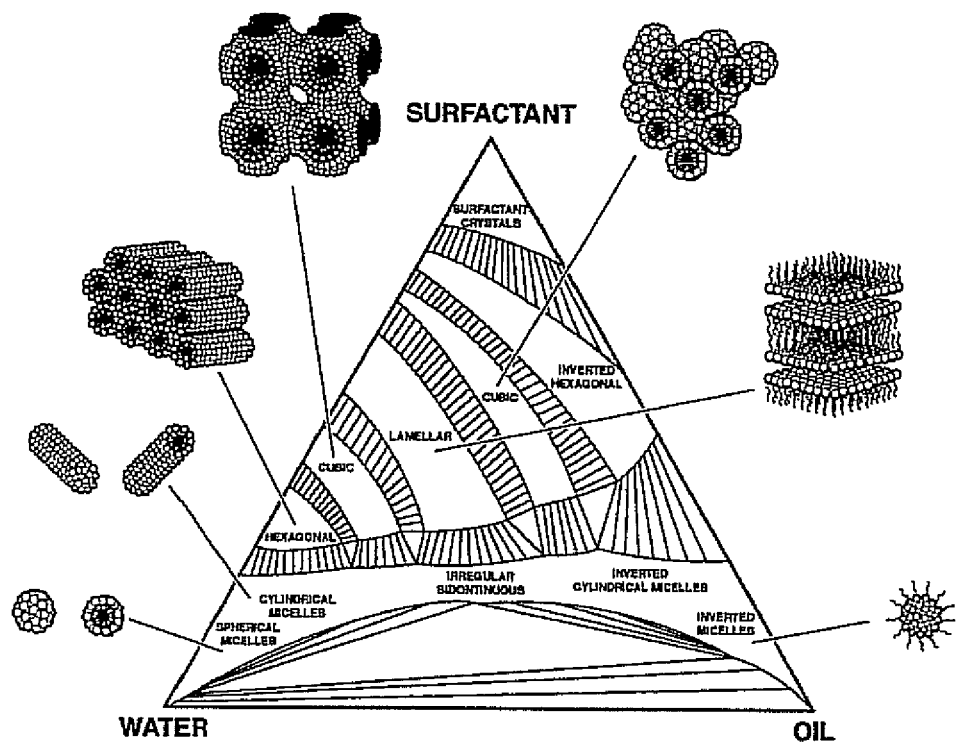
FIG. 3 shows a schematic of a surfactant/water/oil phase diagram typical of lyotropic systems.

FIG. 3 illustrates a typical phase diagram for the self-assembly of amphiphilic molecules (such as surfactants) into various structures, including micelles and hexagonal, cubic, or lamellar liquid crystalline mesophases. The figure shows a typical complex phase diagram for various concentrations of water (or other solvent), amphiphilic molecules (surfactants), and a third component, such as oil. The self-assembly of amphiphilic molecules has never before, to our knowledge, been used in the preparation of thermoelectric materials.

Silicon-containing compounds (such as silicic acid, silane derivatives such as tetraethoxysilane, silicate clusters, and the like) and one or more surfactants can co-assemble to form silicon-containing compound/surfactant nanocomposites containing these ordered surfactant lyotropic liquid crystalline phases via non-covalent interactions such as van der Waals, electrostatic, or hydrogen bonding. Surfactant removal via calcination or solvent extraction results in mesoporous silica replicas of the liquid crystalline surfactant assembly.

Figure 4:
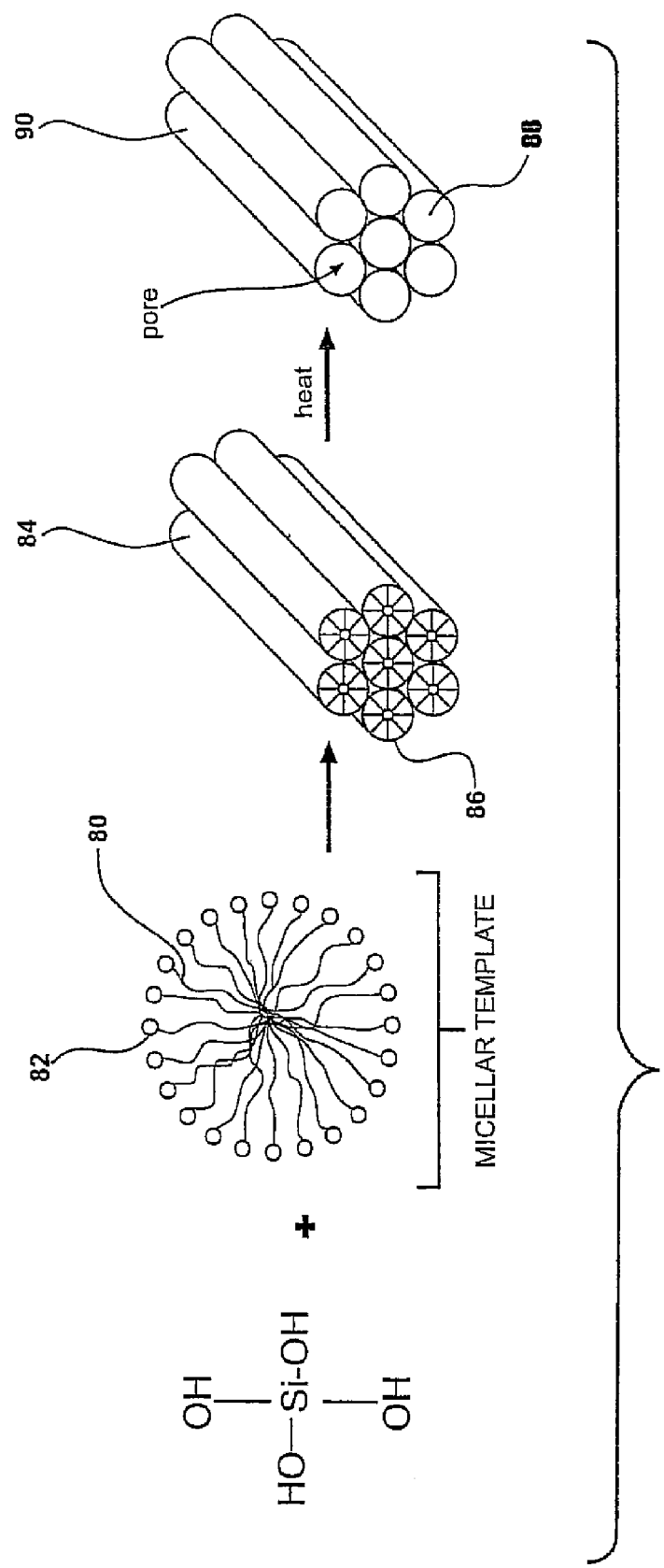
FIG. 4 is a schematic of the formation of mesoporous silica by silicate/surfactant co-assembly.

FIG. 4 illustrates a method for forming porous silica. A silicon-containing compound (such as a hydrolysable silicon-containing compound, for example $Si(OH)_4$) is combined with a self-assembled structure of amphiphilic molecules, the molecules having hydrophilic head group 80 and hydrophobic chains 82. An organic/inorganic composite can then be produced, for example by hydrolyzing silicon-containing groups, having silica walls 84. A cross-section through the silica walls at 86 reveals the hydrophobic chains of the amphiphilic molecules. Further heat treatment drives off or decomposes the organic component, leaving an array of silica nanotubes. Hence, a self-assembled organic molecular structure acts as a template for formation of a silicon-containing material such as silica nanotubes. An improved thermoelectric material can then obtained by at least partially filling the nanotubes with a semiconductor.

This method can be used to prepare mesoporous silica thin films, particles, fibers, or monoliths. These surfactant templated mesoporous silica materials may contain hexagonal, cubic, or lamellar arrayed pore channels, and may have a unimodal pore diameter that is controllable from 2 nm to 20 nm. This process has not before been used in the preparation of thermoelectric materials.

Mesoporous silica templates with controlled pore structures can be prepared using the surfactant templating approach. Different surfactants (see Table 2 below), surfactant concentrations, and synthesis conditions can be used to control the mesoporous structure of the templates. Pore size can be controlled by surfactants of different molecular weight as well as hydrophobic swelling agents (e.g., trimethylbenzene) that may be incorporated within the hydrophobic micelles to increase the template size. The use of higher molecular weight surfactants or swelling agents usually results in large pore sizes. To control the spatial structure of the mesoporous network, appropriate surfactants, surfactant concentrations, and synthesis conditions can be chosen to create pore channels with different shapes and connectivities.

Table 2 below shows example surfactants that can be used as pore templates.

| | |
|---|---|
| Cationic surfactant | $CH_3(CH_2)_nN^+(CH_3)_3Br^-$ |
| Non-ionic surfactant | $CH_3(CH_2)_n(OCH_2CH_2)_nOH$ |
| Block Copolymer | $H(OCH_2CH_2)_n(OCH_2CH_3CH)_m(OCH_2CH_2)_nOH$ |
| Anionic surfactant | $CH_3(CH_2)_nSO_3^-Na^+$ |

Semiconductor can be grown within the porous channels using electrochemical or other methods, for example using methods such as described in M. S. Martin-González et al., "Insights into the Electrodeposition of $Bi_2Te_3$," J. Electrochem. Soc., Vol. 149, pp. C546-C554 (2002); M. Takahashi et al., "Preparation of $Bi_2Te_3$ Films by Electrodeposition from Solution Containing Bi-Ethylenediaminetetraacetic Acid Complex and $TeO_2$," J. Electrochem. Soc., Vol. 150, pp. C169-C174 (2003); A. L. Prieto, et al., "Electrodeposition of Ordered $Bi_2Te_3$ Nanowire Arrays," J. Am. Chem. Soc.Vol. 123, pp. 7160-7161 (2001); and J.-P. Fleurial et al., "Electrochemical deposition of $(Bi,Sb)_2Te_3$ for thermoelectric microdevices," in Thermoelectric Materials 2000: The Next Generation Materials for Small-Scale Refrigeration and Power Generation Applications, Proc. Mat. Res. Soc. Vol. 626, ed by T. M. Tritt, et al. (MRS, Wannendale, PA, 2001) p. Z11.3; M. S. Sander, R. Gronsky, T. Sands and A. M. Stacy, "Structure of Bismuth Telluride Nanowire Arrays Fabricated by Electrodeposition into Porous Anodic Alumina Templates," Chem. Mat., Vol. 15, pp. 335-339 (2003); S. Heini, "Electrodeposition of PbS, PbSe and PbTe thin films," VTT Publications Vol. 423, pp. 1-137 (2000); Melosh, N. A. et al., "Molecular and Mesoscopic Structures of Transparent Block Copolymer-Silica Monoliths"; *Macromolecules;* 1999, 32, 4332-4342; Pang, J. B. et al., "A novel nonsurfactant pathway to hydrothermally stable mesoporous silica materials"; *Microporous and Mesoporous Materials;* 2000, 40, 299-304; Pang, J. B. et al., "Preparation of mesoporous silica materials with non-surfactant hydroxycarboxylic acid compounds as templates via sol-gel process"; *Journal of Non-Crystalline Solids;* 2001, 283, 101-108; Yang, H. et al., "A fast way for preparing crack-free mesostructured silica monolith"; *Chemistry of Materials;* 2003, 15, 536-541, and Wang, D. et al., "Electrodeposition of metallic nanowire thin films using mesoporous silica templates"; *Advanced Materials* (Weinheim, Germany); 2003, 15, 130-133. Other methods can be used.

Using a surfactant-based approach, nanowire diameters are controllable from 2 nm to 20 nm while the volume densities of the nanowires are controllable from 30% to 70%. Other diameters and volume densities are also achievable. The nanowire compositions can be chosen based on system temperature For example, Bi-doped PbTe—SnTe (n-type) and PbTe—SnTe (p-type) can be used at the temperature range of 500-700K. Continuous, quantum confined, and high-density nanowire networks can be fabricated, which provide better efficiency and power densities, and make devices much more easily fabricated, for example from nanowire or nanomesh monoliths that have controlled macroscopic dimensions.

Figure 5A:
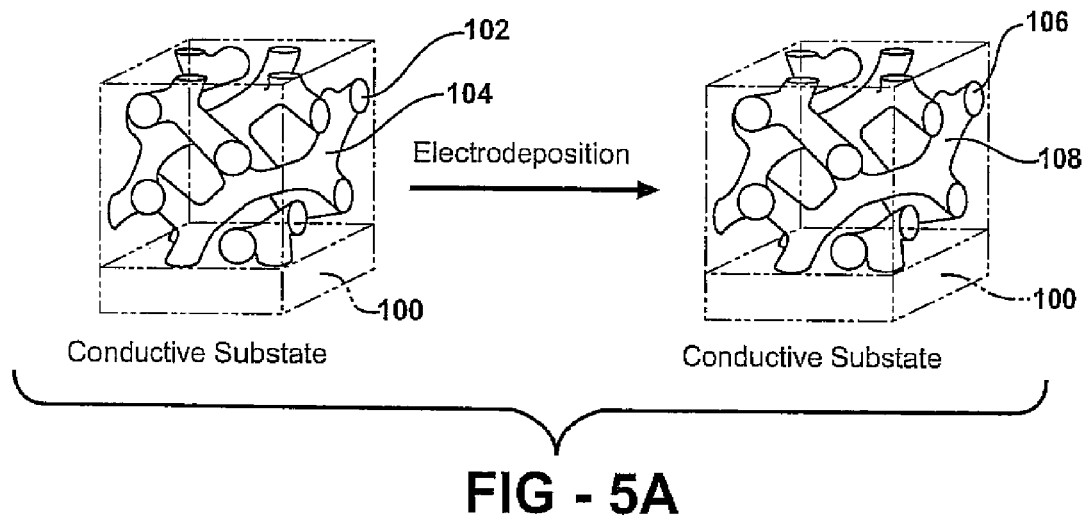
FIG. 5A illustrates a semiconductor/ceramic nanocomposite prepared by confined electrodeposition using mesoporous oxide templates.

FIG. 5A shows the fabrication of nanomesh thin films using mesoporous silica templates that contain three-dimensional pore channels. First, a mesoporous silica thin film, having pores 102 with silica walls 104, is coated on a conductive substrate 100 that serves as a working electrode. Electrodeposition continually grows semiconductor within the ordered pore channels from the conductive substrate, resulting in silica/semiconductor nanocomposites that contain continuous metal or semiconductor nanomesh architectures (e.g. 106) within silica walls 108.

The example shown in FIG. 5A is a bicontinuous structure, in that the semiconductor (or other electrical conductor) and electrical insulator components are both continuous. The electrical insulator component need not form a continuous network. For example, a semiconductor nanostructured network may extend around electrically insulating particles with the semiconductor, and the electrically insulating particles may be isolated from each other.

Electrodeposition can be used with any porous structure, not just those made using a surfactant approach.

Figure 5B:
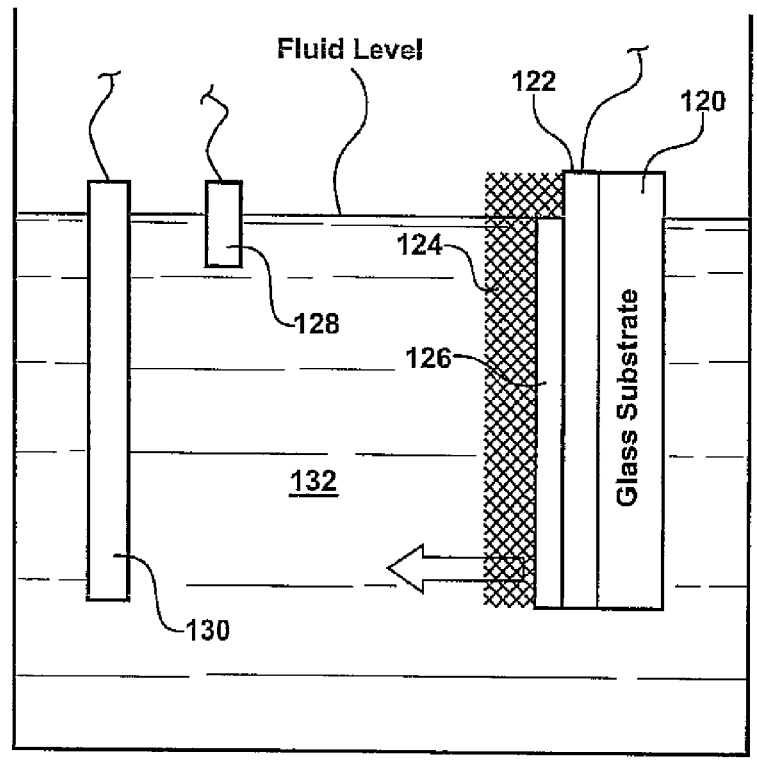
FIG. 5B shows a schematic of electrodeposition of nanowires using a three-electrode circuit and a mesoporous silica template.

FIG. 5B shows an apparatus that can be used for electrodeposition of nanostructured semiconductor into a mesoporous template. The apparatus comprises a glass substrate 120, conducting electrode 122, a nanoporous template 124, reference electrode 128, counter electrode 130, and electrolyte 132. Nanowires grow within the nanoporous template, starting close to the electrode, providing a nanostructured composite within a region such as shown at 126.

EXAMPLE 1

Porous silica templates were prepared using surfactants as porogens. The surfactants used included PLURONIC surfactant P123 ($EO_{20}PO_{70}EO_{20}$), F127 ($EO_{100}PO_{70}EO_{100}$), Brij-58 ($C_{16}H_{33}EO_{20}$), and cetyltrimethylammoniumbromide (CTAB), where EO and PO designate ethylene and propylene oxide, respectively. The templates were prepared using the surfactant templating process. The average pore diameters of the pores templated with F127, P123, Brij-58, and CTAB were around 12, 9, 6, and 2 nm respectively.

Bismuth telluride was deposited using a three-electrode deposition circuit. 0.075 M bismuth and 0.1 M telluride dissolved in 1M $HNO_3$ solutions were used as the precursor solution and electrolyte. The deposition was conducted at 0.1 V vs. Ag/AgCl using an Ag/AgCl reference electrode and a Pt counter electrode. The deposition was conducted at room temperature.

XRD pattern and TEM observation confirmed that $Bi_2Te_3$ nanowires with diameter about 6 nm, 9 nm, and 12 nm were deposited with the intertwined ceramic matrix.

Figure 6:
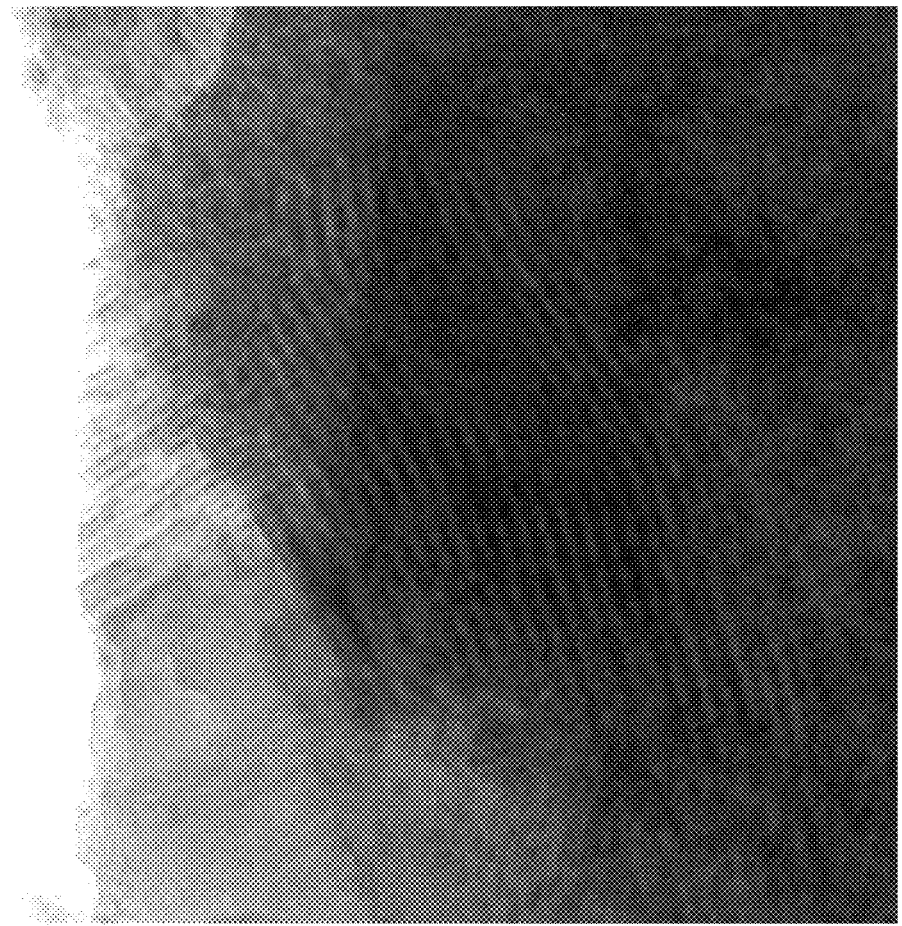
FIG. 6 shows a TEM image of electrodeposited $Bi_2Te_3$ nanowires.

FIG. 6 shows a TEM image of electrodeposited $Bi_2Te_3$ nanowires. EDX of the sample confirmed the formation of $Bi_2Te_3$, the atomic element percentage was 37.46% Bi, 62.54% Te.

Figure 7:
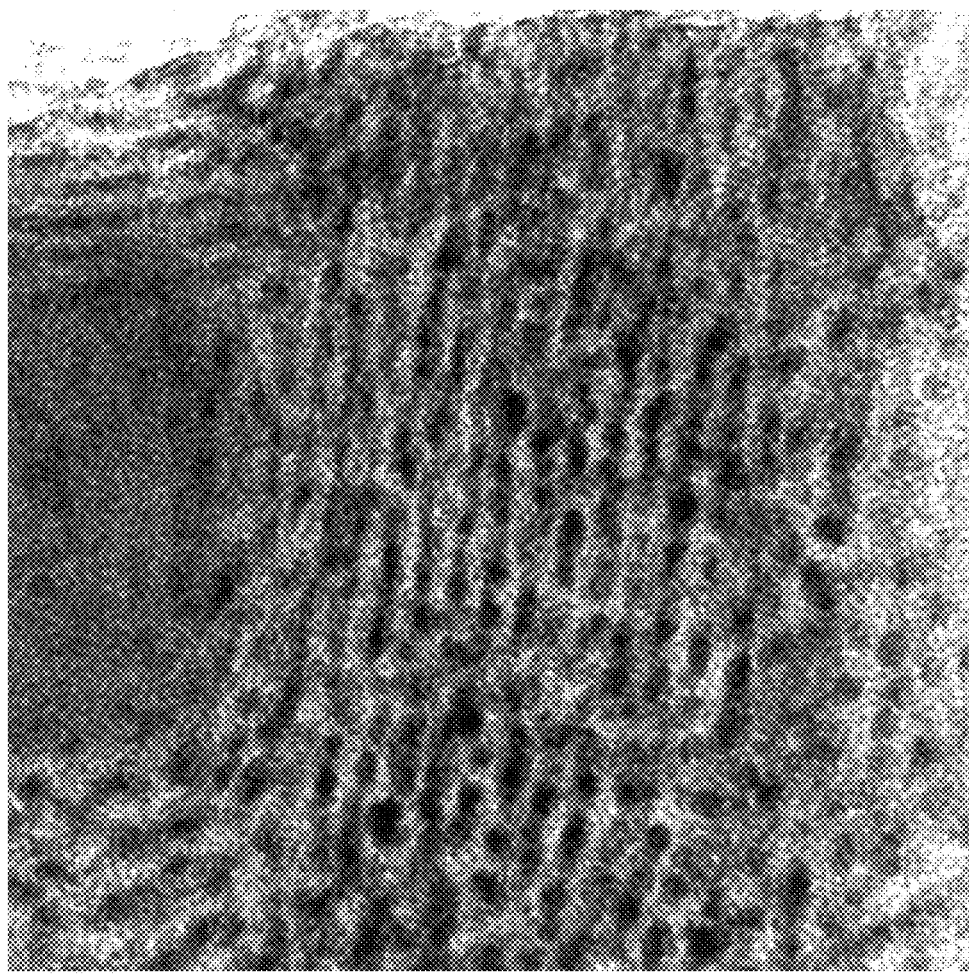
FIG. 7 shows an HRTEM image of electrodeposited $Bi_2Te_3$ nanowires.

FIG. 7 shows an HRTEM image of electrodeposited $Bi_2Te_3$ nanowires.

EXAMPLE 2

A xerogel mesoporous silica was fabricated by using sol-gel technique with PLURONIC surfactant P123 as template. The pore diameter of the as-prepared silica with hexagonal mesostructures was about 9 nm. The precursor solution of $Bi_2Te_3$ was prepared by dissolving 0.0225 mol Te and 0.015 mol $Bi(NO_3)_3 \cdot 5H_2O$ in 150 mL 6 M $HNO_3$ at 60° C.

5 g powder of xerogel mesoporous silica was added to 7 mL precursor solution. The sample was placed in liquid nitrogen for 3 min. After degassing by vacuum, the sample was warmed to room temperature. Silica powder was separated from precursor solution by centrifugation and then heated at 100° C. in vacuum to remove the solvent. Three and eight cycles of the above process have been conducted in order to increase the loading of bismuth telluride inside the mesoporous materials.

After infiltration, mesoporous silica with $Bi_2Te_3$ precursor was put into tube furnace. With flowing hydrogen, the temperature was increased to 450° C. and kept at this temperature for 30 hours.

Figure 8A:
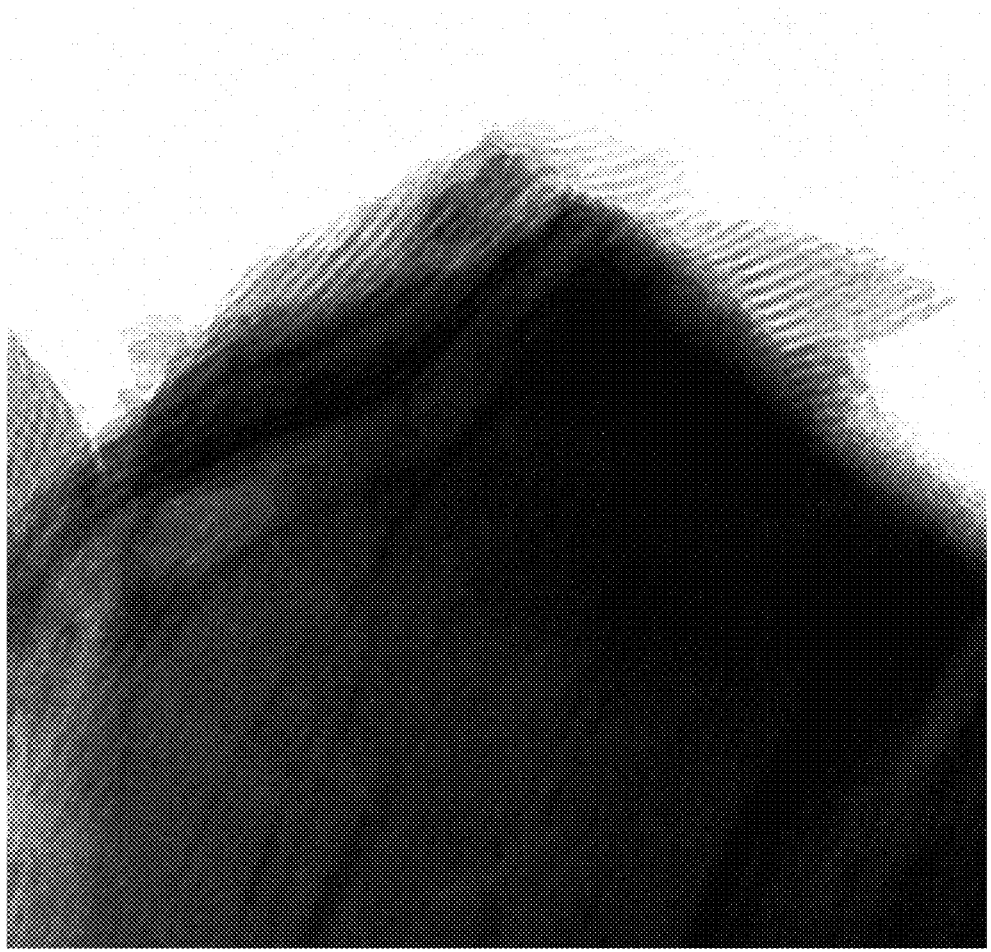
FIG. 8A shows a TEM image of a $Bi_2Te_3$-mesoporous silica composite.

FIG. 8A is TEM image of $Bi_2Te_3$-mesoporous silica composite, in which the impregnation of in part of the highly ordered mesoscale channels of xerogel silica could be observed clearly.

Figure 8B:
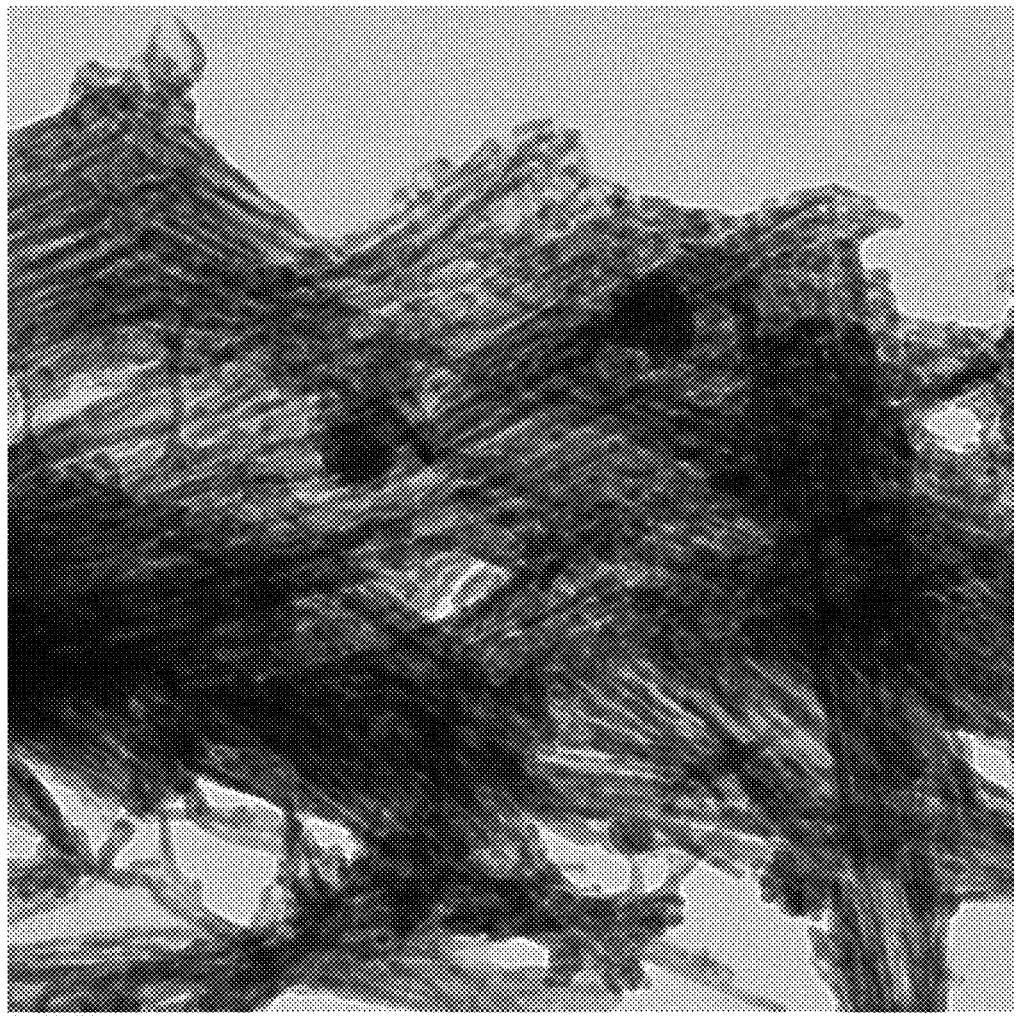
FIG. 8B shows a TEM image of $Bi_2Te_3$ nanowires after removal of silica template using HF.

FIG. 8B shows $Bi_2Te_3$ nanowires with diameter less than 10 nm after dissolving xerogel silica with diluted (5 wt. % aqueous solution) HF.

Figure 8C:
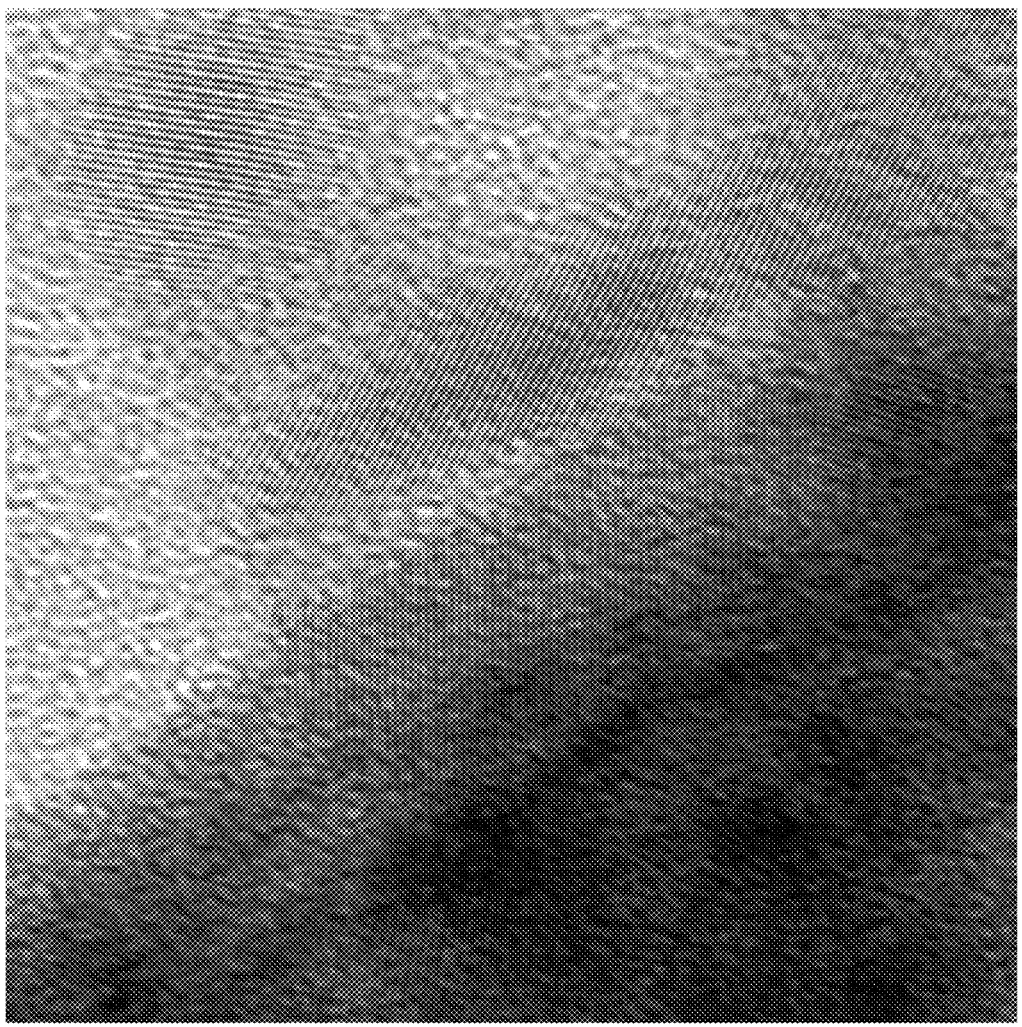
FIGS. 8C and 8D show HREM images of $Bi_2Te_3$ nanowires.

FIG. 8C shows high-resolution electron microscopy (HREM) image of $Bi_2Te_3$ nanowires, indicating that they are single crystals.

Figure 8D:
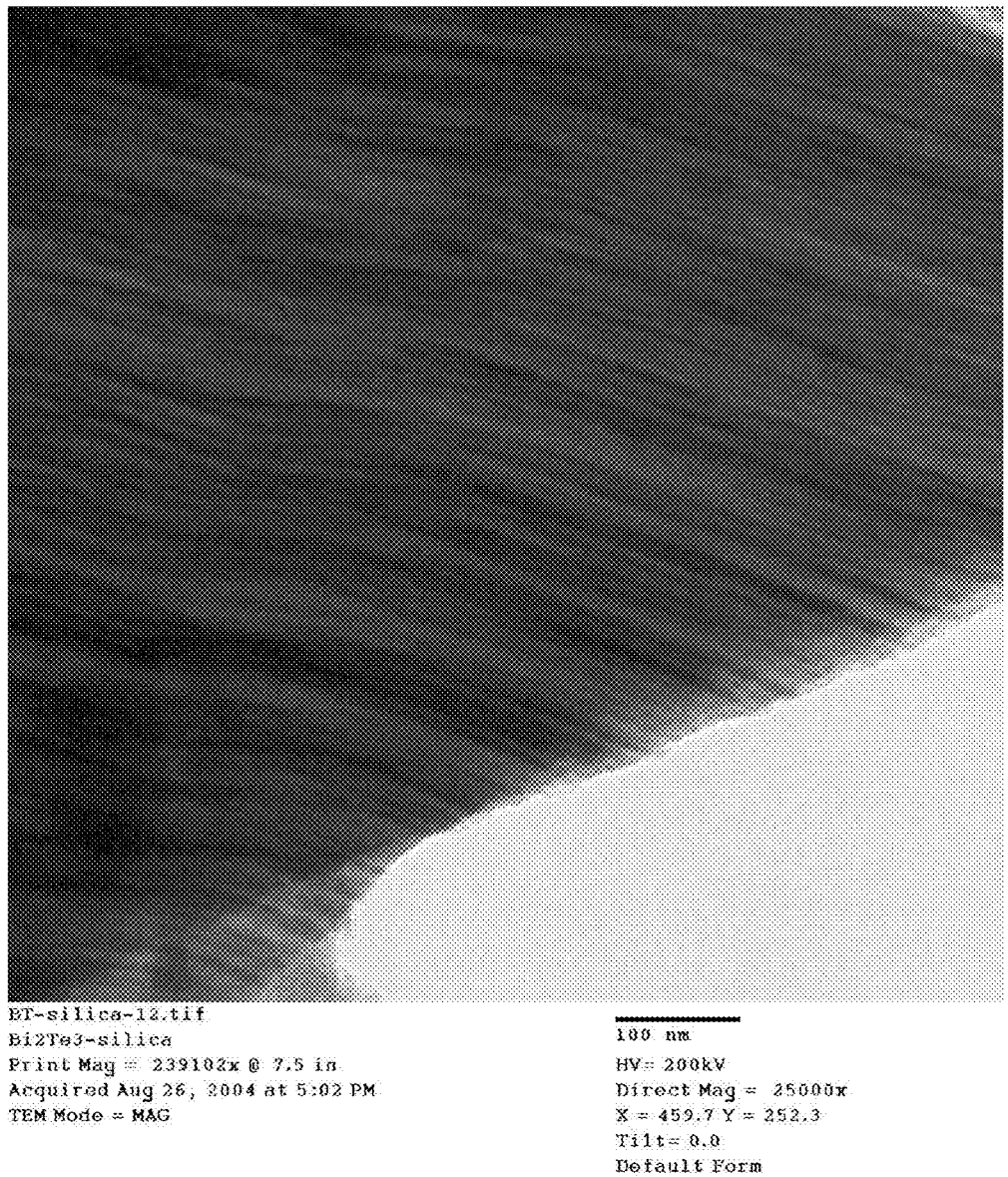

FIG. 8D shows a TEM image of a $Bi_2Te_3$ mesoporous silica composite after removal of the silica template using HF.

Nitrogen adsorption experiments show that the pore volume of a typical mesoporous silica sample is 0.6472 $cm^3/g$. Assuming all the pores can be filled with bismuth telluride precursor solution, after every cycle of infiltration, the loading of $Bi_2Te_3$ in the $Bi_2Te_3$-mesoporous silica composite could be 2 wt. %. So after 8 times infiltration, the total weight content of $Bi_2Te_3$ could be 16% provided there is no significant decrease of pore volume after infiltration.

Figure 9A:
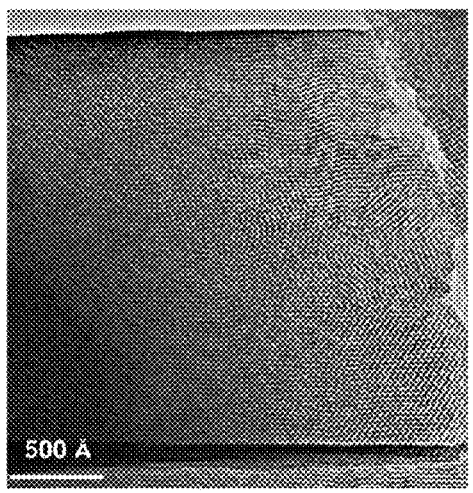
FIGS. 9A and 9B show representative TEM cross-sectional images of mesoporous silica thin films.
Figure 9B:
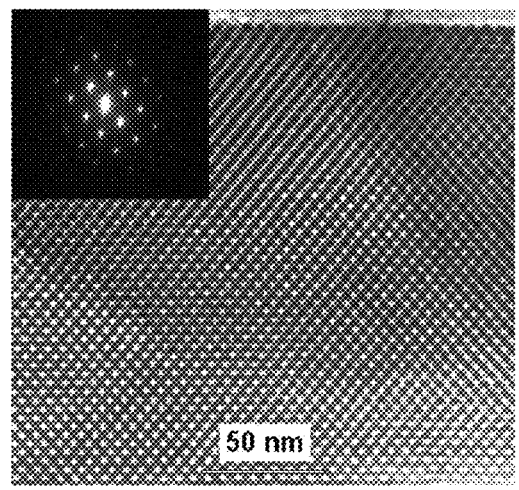

FIGS. 9A and 9B show representative TEM cross-sectional images of mesoporous silica thin films that were prepared using cetyltrimethylamonium bromide (CTAB) and Brij-58 $(CH_3(CH_2)_{15}(OCH_2CH_2)_{20}OH)$ surfactant, respectively. The CTAB-templated thin film (FIG. 9A) contains swirling pore channels (pore diameter ~3 nm) arranged into an ordered 2-D hexagonal mesostructure. The B58-templated thin film (FIG. 9B) contains pore channels (pore diameter ~5 nm) arranged into an ordered 3-D cubic mesoporous network. The selective area electron diffraction of the ordered mesostructure is shown in the inset of FIG. 9B. Similarly, mesoporous silica monoliths could be prepared using the same assembly process, and filled with semiconductor using, for example, electrodeposition using the apparatus of FIG. 5B. These representative TEM images clearly suggest an efficient approach to fabricate mesoporous silica templates with controlled pore size and pore geometry (e.g., hexagonal and cubic pore network).

The nanowire structure can be controlled by the pore structure of the templates. For example, templates containing 2D hexagonal pore channels allow the fabrication of 2D nanowires; while the use of templates with 3D connective pore channels allow the fabrications of 3D nanowire networks. Such connective networks provide highly connective pathways for electron transport.

Electrodeposition

Altering electrodeposition conditions and precursor composition allows improved control over the chemical compositions and doping. For example, semiconductors such as CdSe, CdTe, CdS, PbSe, PbTe, and PbS can be deposited within the mesoporous channels. Such composition control in turn allows tuning of device transport properties Side reactions can occur that produce hydrogen bubbles, which may be trapped inside the pore channels and block the diffusion of reactants. Deposition conditions (e.g., concentrations, potentials, currents, temperature, and stirring rate) and use different deposition techniques (e.g., pulse deposition) can be adjusted to minimize the side reactions and control the mass transport and reaction kinetics, giving substantially complete pore filing, improved composition control, and precise mesostructure replication.

Devices can be prepared having both n-type and p-type legs within a single monolithic nanostructured composite. Higher hole concentrations in a p-type leg can be obtained by doping the semiconductor with higher valence metal ions, or by creating a deficiency of anion sites, or by replacing the anion with a lower valence ion. For example, p-type $Bi_2Te_3$ can be obtained by replacing $Bi^{3+}$ with $Sn^{4+}$ in the crystal structure, or by creating a deficiency of $Te^{2-}$ sites (such as in $Bi_2Te_{3-x}$, x>0), or replacing $Te^{2-}$ with lower valence ions. Similar concepts can be used to form the n-type semiconductor.

By controlling cathodic potential, stoichiometric and non stoichiometric (both p-type and n-type) $Bi_2Te_3$ can be deposited. Electrodeposition of n-type $Bi_2Te_3$ by introducing lead ions to the electrolyte solution is also possible.

Hence, a bulk porous medium (such a mesoporous ceramic) can be provided, and semiconductor deposited within the pores. For example, $Bi_2Te_3$ or other semiconductor can be electrodeposited into monolithic mesoporous silica. Dopants (such as n- and p-type dopants) can be infused along nanopores of an intrinsic semiconductor so as to provide an electrically conducting nanostructured network.

Composites Formed from Particles

Particles may have an internal nanostructure. The particles may be formed from grinding or milling semiconductor infused nanoporous insulating materials. A particle may have nanostructured inclusions within a ceramic or other electrically insulating material.

Figure 10:
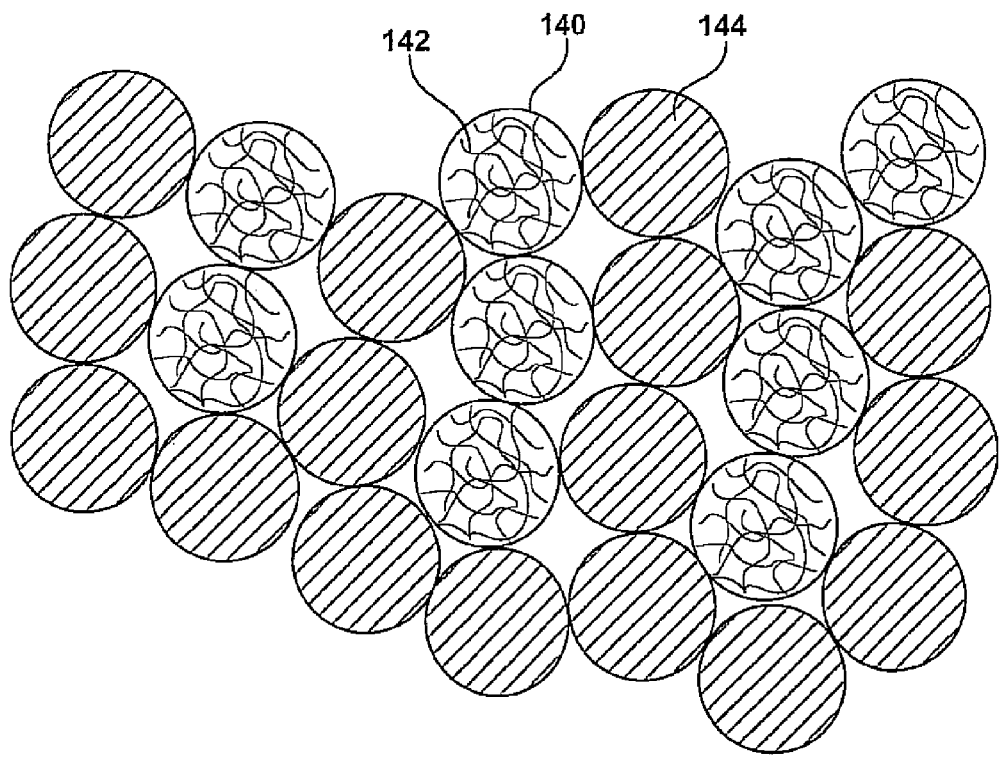
FIG. 10 illustrates a mixture of ceramic particles filled with semiconductor nanowires and semiconductor nanoparticles, which can be used to form a composite according to an example of the present invention.

FIG. 10 illustrates a mixture of particles 140, which are ceramic particles including semiconductor nanowires such as nanowire 142 as part of an internal nanostructure, and semiconductor nanoparticles 144. The mixture can be pressed (for example, hot pressed) to form a disk or other bulk form of thermoelectric material. Ceramic particles may also be prepared having nanowires included in an internal nanostructure.

In other examples, a nanostructured composite can be formed from particles 140, without semiconductor particles. A continuous semiconductor network can be provided by contacts between particles. Particles can also be provided with a semiconducting shell.

Ceramic/semiconductor nanocomposites can be also prepared by infiltrating a semiconductor (or semiconductor precursors) within porous ceramic powders. The porous ceramic powders can be mesoporous silica prepared using the surfactant templating approach or other commercial available porous ceramic powders. Semiconductor precursors may be gaseous (such as hydrides), or liquid materials.

Thermoelectric nanocomposites can also be fabricated by a method including an HIP process. Starting materials may include ceramic particles, semiconductor particles, and semiconductor-infiltrated ceramic particles. Ceramic particles may include mesoporous particles, such as mesoporous silica.

Hot pressing of ceramic/semiconductor powder mixtures allows improved thermoelectric materials to be fabricated, in bulk and at low cost. In one example, ceramic and semiconductor powders are mixed, and a hot-press method is then used to form a bulk material from the mixture. In one example, mixture of semiconductor nanoparticles and ceramic powder can be pre-pressed at 10 MPa and 150° C. to form a disk of approximately 1 inch diameter. The disk (or other shape) can then be subjected to an HIP process at 200-600 C and 100-200 MPa. This process can be used to form improved thermoelectric materials.

The ceramic particles can be nanoparticles, and may comprise silica, alumina, or other oxides. Ceramic particles may be prepared using a ball milling process or other process. Commercially available particles can be used. Particles of other electrically insulating materials can be used.

Semiconductor particles (or other electrically conducting particles) may be nanoparticles of material that has thermoelectric properties in bulk, such as bismuth telluride. Semiconductor nanoparticles can be prepared using a solution chemistry method, gas phase reaction method, high-energy ball milling, or other method.

The semiconductor and ceramic particles can be mixed and then pressed into monoliths. To obtain good particle mixing, ball milling of these particle mixtures can be used. Using a hot-press method, the mixed ceramic/semiconductor particles can be pressed to bulk. Particles may fuse together to provide mechanical strength, while retaining nanoparticle structure.

Figure 11:
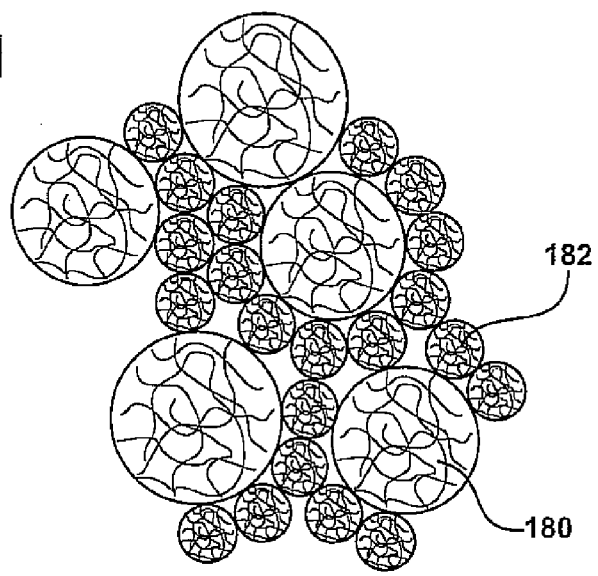
FIG. 11 illustrates a thermoelectric composite formed from mixed particles.

FIG. 11 illustrates a composite formed by particles 180 and nanoparticles 182. As shown, both particles include a nanostructured semiconductor, as discussed above in relation to FIG. 10.

In other examples, larger ceramic particles and semiconductor nanoparticles can be combined, with the semiconductor nanoparticles forming a nanostructured electrically conducting network around the ceramic particles.

In other examples, a mixture of ceramic nanoparticles and semiconductor particles are combined and pressed. The materials can be chosen such that the ceramic particles resist crushing at pressures that tend to crush the semiconductor particles (e.g. silica and bismuth telluride). Applying an appropriate pressure tends to crush the semiconductor particles to a diameter correlated with (for example, similar to) the diameter of the ceramic nanoparticles. Silica nanoparticles can be obtained from inexpensive commercial sources with diameters such as 2-20 nm, allowing an inexpensive composite including semiconductor nanoparticles to be prepared by a method including combining ceramic and semiconductor particles, the ceramic particles having a diameter of 2-20 nm, and applying pressure to the mixture to reduce the size of the semiconductor particles to 2-20 nm.

Hot Pressing

An example process for forming a thermoelectric composite is as follows. In the first step, nanoparticles of semiconductor and ceramic are formed via high-energy ball milling or other mechanical or chemical methods. In a second step, the nanoparticles are mixed in the appropriate ratios, pre-pressed in a mechanical press, then densified in inert gas in a hot isostatic press (HIP) to pressures in excess of 60,000 psi at temperatures up to 2000° C. One benefit of this technique is that relatively complex shapes can be fabricated in a HIP process, or other consolidation process, without introduction of sample anisotropy. Furthermore, additional layers such as metallic electrodes can be directly fused to the thermoelectric surface during the HIP process. Temperature, pressure and pressurizing gas composition can all be controlled in the HIP step. Densities of the products obtained with this process were near-theoretical.

In other examples, heat, pressure, or a combination of heat and pressure are used in place of the HIP process. A vacuum step, to remove gases from the mixed particles before they are pressed to bulk, may provide a useful increase in the density of the formed composite.

Additional components can be incorporated prior to material consolidation to further lower thermal conductivity, while allowing the nanocrystallinity and quantum size effects to be maintained in the thermoelectric composite. Materials such as $SiO_2$, yttria stabilized zirconia and $La_2O_3$-doped YSZ can be used, due to their grain stability and thermal expansion coefficient. However, the invention is not limited to these examples. The overall thermal conductivity of the composite thermoelectric is expected to be below any single component (semiconductor or ceramic) governed by the rule of mixing due to the formation of nanoscale networks within the composites.

Thermoelectric nanocomposites were made using both the template-assisted electrodeposition and HIP fabrication processes. A 2 mm thick and 1 inch-diameter nanocomposite disk was prepared by a HIP process using nanoparticles of $Bi_2Te_3$ (diameter about 100 nm) and $SiO_2$ (diameters approximately 10-20 nm).

Figure 12A:
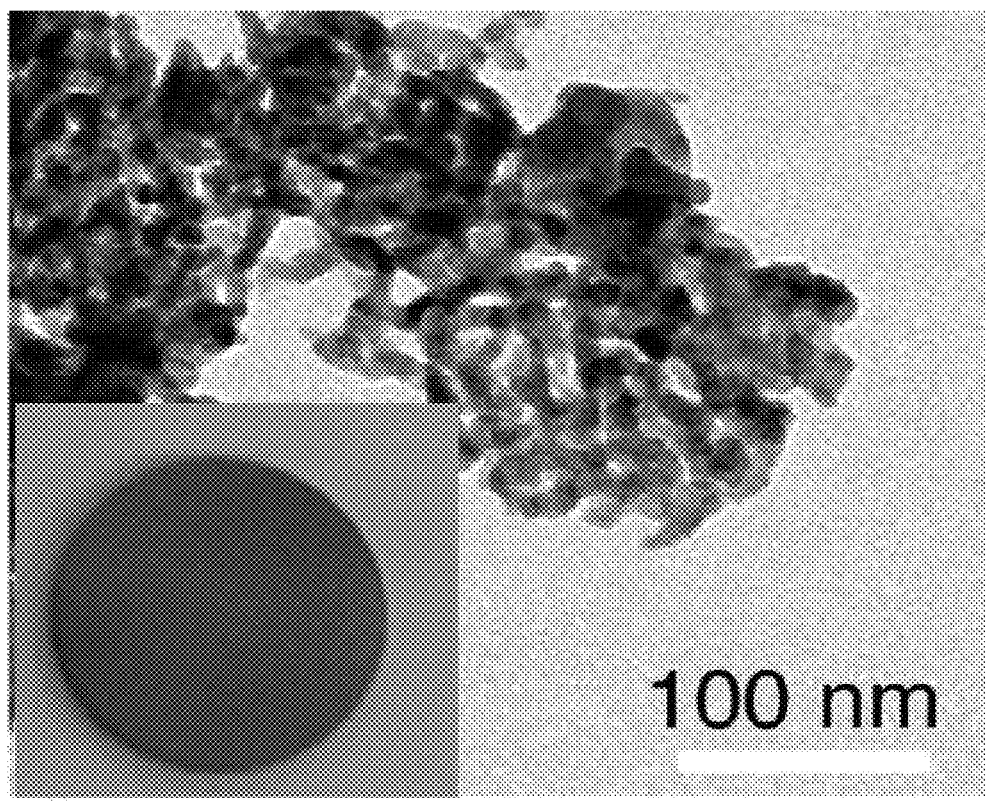
FIG. 12A shows a TEM image of a $Bi_2Te_3$ nanowire network after $SiO_2$ removal from a disk sample, shown as an inset photograph.

FIG. 12A shows a TEM image of the $Bi_2Te_3$ nanowire network after $SiO_2$ removal from the disk sample, shown as an inset photograph. The $Bi_2Te_3$ nanoparticles form a continuous nanowire network after the HIP process.

Figure 12B:
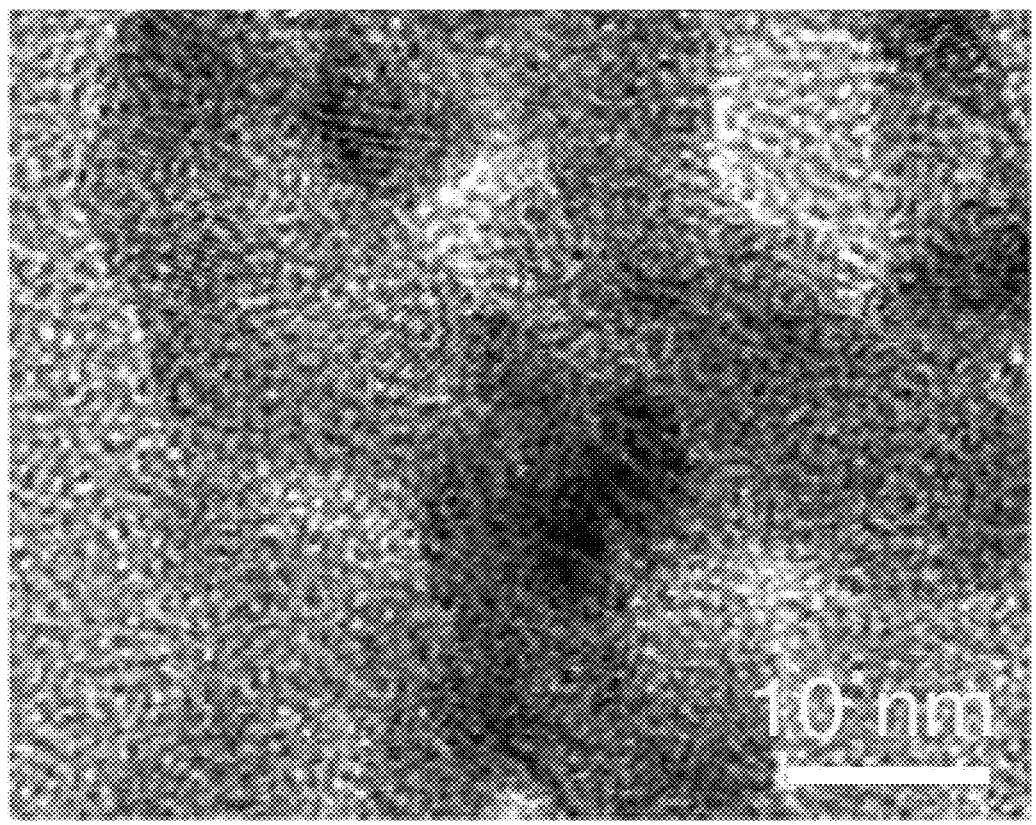
FIG. 12B presents a high resolution TEM image of the nanowire network shown in FIG. 12A.

FIG. 12B presents a high resolution TEM image of the nanowire network shown in FIG. 12A, indicating a highly crystalline nanowire structure with small crystalline domains. These results strongly demonstrate the feasibility of producing nanowire/ceramic nanocomposites through the HIP-based net-shape fabrication technique.

Thermoelectric composites according to the present invention can comprise two bicontinuous materials (a continuous semiconductor network, and a continuous ceramic matrix). However, the ceramic component need not be continuous, and may, for example, be present as isolated ceramic particles within a semiconductor or other electrically conducting material.

Figure 13A:
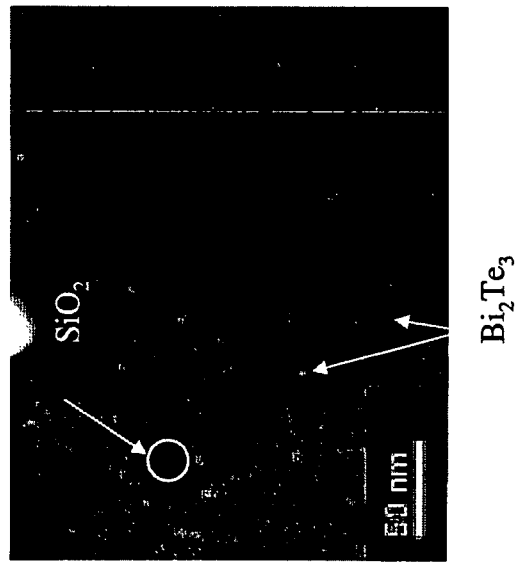
FIG. 13A shows a TEM image of a $Bi_2Te_3$ network having particles of $SiO_2$ dispersed in the network.
Figure 13:
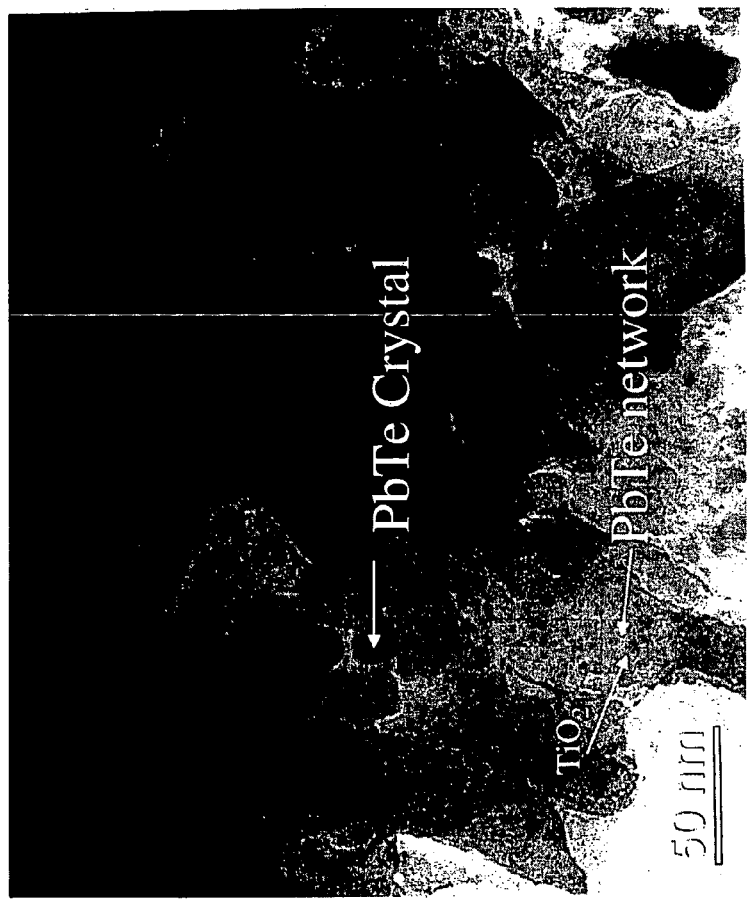
FIG. 13B shows a TEM image of a PbTe network having particles of $TiO_2$ dispersed in the network.

Referring to FIG. 13A, there is shown a TEM image of a thermoelectric composite formed of $Bi_2Te_3$ and $SiO_2$. The sample was formed from particles that were ball mixed and subjected to a hot pressing or sintering operation at an elevated pressure and at a temperature around the melting temperature of the semiconductor material. As can be seen in the figure, the semiconductor material, $Bi_2Te_3$, forms a network in which the ceramic or inorganic oxide material, $SiO_2$, is dispersed. In this manner the thermoelectric composite may be a network of the semiconducting first component having a lower melting temperature than the ceramic second component with the second component being dispersed in the network of the first component.

Thermoelectric transport measurements were made on the sample of FIG. 13A having 70% (by volume) $Bi_2Te_3$ nanoparticles and (30%) silica nanoparticles. The electrical resistivity was 40 mΩ/m, a thermal conductivity, k=0.2 W/mK and a Seebeck coefficient S=−250 mV/K at room temperature. The nanocomposite shows a dramatically reduced thermal conductivity, a similar Seebeck coefficient, but a higher electrical resistivity. The calculated ZT of the nanocomposites is around 2.4 at room temperature.

The high ZT may be attributed to the unique bicontinuous nanowire network structure. Nanocomposites of semiconductors and inorganic silica particles, or nanocomposites of semiconductor and a polymer also show greatly reduced thermal conductivity due to the enhanced phonon scattering along the boundaries However, there is no previous report on fabricating bulk thermoelectric materials using nanoscale semiconductor and ceramic materials.

Referring to FIG. 13B there is shown a TEM image of another example of a thermoelectric composite formed of a network of a first semiconducting component having a second ceramic or inorganic oxide component dispersed therein. A composite of a first component of PbTe and a second component of $TiO_2$ was formed by dispersing nanoparticles of the two components in a solvent, such as hexane, although any solvent having compatibility with the particles may be used to uniformly disperse the particles with each other. The solvent is evaporated leaving a mixture that may then be subjected to a hot pressing or sintering operation, as described above with reference to FIG. 13A. The temperature of the sintering operation is around the melting temperature of the semiconducting component such that a network of the first component has nanoparticles of the second component dispersed in the network. As can be seen in the figure, particles of $TiO_2$ are dispersed in a network of PbTe.

The HIP process can be optimized by adjusting processing parameters such as temperature (room temperature to 2000° C.), pressure (up to 60,000 psi) and atmosphere (air, He or other gas).

A hot-pressing technique may also be used in place of a HIP process to produce the bulk thermoelectric materials at lower cost. Hot-pressing techniques can be used to produce similar thermoelectric nanocomposites. The hot-pressing temperature and pressure can be optimized to achieve desired properties, such as electrical conductivity, mechanical strength, or a combination of properties. For example, the pressure can be chosen to be below that which destroys nanostructures within the pressed material.

In some experiments, silica nanoparticles and larger semiconductor nanoparticles were mixed and pressed. The particle diameter of the semiconductor was reduced by the pressing process to become approximately the diameter of the silica nanoparticles. Hence, a thermoelectric composite can be made by mixing semiconductor particles and silica nanoparticles having a diameter, the diameter being of the scale associated with quantum size effects in a semiconductor. Pressing the mixture then gives the thermoelectric nanocomposite.

Other methods and materials can be used to bind particle mixtures, such as irradiation by a laser or other radiation source (such as x-ray, UV, optical, or IR radiation; or ultrasound), provision of a binder (such as a conducting adhesive), and the like.

A powder to be hot pressed may include semiconductor nanowires, nanoparticles, nanostructured particles, or a combination of nanostructured semiconductor materials. Nanoparticles can be spherical or ovoid, but may also be granular. A particle size distribution may be present, for example centered in the nanoscale range. Particles may include more than one species of semiconductor, or more than one species of electrical insulator. Nanocomposites can be annealed under different conditions to strengthen their mechanical properties and to achieve better crystalline structure.

Nanoparticles can be fabricated a wet chemistry approach, such as the direct reaction of organometallic precursors, precipitation approach, hydrogen reduction of co-precipitated hydroxides, solvothermal process and/or sonothermal processes, and sol-gel chemical approaches. The particle size, particle size distribution and crystalline structure can be characterized using TEM, SEM, XRD, and other methods, if desired.

Material Systems

The first component can be an electrically conducting material such as a semiconductor or metal. The first component can be an inorganic material, or an organic material such as a conducting polymer or organic semiconductor.

In the temperature range 300K>T>500K, the n-type material can be $Bi_2Te_3$ or $Bi_2Se_3$ and the p-type material can be $Bi_2Te_3$ or $Sb_2Te_3$. For temperature range 500K>T>700K, the n-type material can be PbTe or SnTe doped with Bi, and the p-type material can be PbTe or SnTe.

High-ZT superlattices of $Bi_2Te_3$/PbTe have been prepared in the form of thin films. Three-dimensional networks of $Bi_2Te_3$/PbTe may show similar improved performance due to the enhanced phonon scattering and similar electron conductivity and Seebeck coefficient. Semiconductors used may include $Bi_2Te_3$, $Sb_2Te_3$, PbTe, SnTe, ZnSb, SiGe, CoSb alloys, and CeFeCoSb alloys.

A metal nanostructured network can also be used, in place of or in addition to a semiconductor nanostructured network, for example including Ag, Au, Co, Cu, Fe, Ni, Pd, or Pt, or other metal (such as a transition metal), or alloy. For example, a metal nanostructure can be used in an n-type region of a nanocomposite.

The second component, or matrix material, can be a non-electrically conducting material such as silica. In other examples, the second component can be an electrically conductive ceramic such as ZnO, or even with a thermoelectric ceramic, for example to improve the electrical conductivity. The matrix material can be a low thermal conductive material (compared with the first component) such as air (such as bubbles or other voids in a first component), or a porous material such as porous $Bi_2Te_3$. For example, the following nanocomposites can be formed using $Bi_2Te_3$ as the first component: $Bi_2Te_3$/$SiO_2$, $Bi_2Te_3$/PbTe, $Bi_2Te_3$/ZnO, $Bi_2Te_3$/carbon nanotubes, and $Bi_2Te_3$/air.

Matrix materials can include $Al_2O_3$, $LaCoO_4$, $NaCoO_4$, $SiO_2$, $SnO_2$, ZnO, $(ZnO)_x(In_2O_5)_y$, ZrO, Y-stabilized ZrO, $ZrO_2$, yttria stabilized $ZrO_2$ (YSZ), $La_2O_3$ stabilized YSZ, and other oxide materials, carbon nanotubes, electrically insulating polymers, fullerenes such as $C_{60}$, and gases (such as air, nitrogen, inert gases).

Additional Components

A thermoelectric composite material according to the present invention may further include other materials and/or structures, such as air (for example, in voids), electrically insulating cores on which nanolayers of semiconductor or electrical insulator are deposited, and binding agents or fibers to increase mechanical strength.

Ceramic or other electrically insulating particles may be hollow. In other examples, particles may include a ceramic core and an outer shell layer, the shell layer promoting inter-particle binding. For example, the shell layer may have a lower melting or sintering temperature. In other example, particles may have nanolayers of a semiconductor or conductor on a ceramic or other insulating core.

Other pressing and/or sintering methods can be used. A binding agent can also be added to a mixture of semiconductor and ceramic particles.

Other Applications

Other applications of thermoelectric materials and devices according to the present invention will be clear to those skilled in the art. Applications include electrical power generation in vehicles such as automobiles, airplanes, and spacecraft. A thermal gradient can be provided by operation of an engine, burning fuel, solar energy, or other source of energy.

Materials and devices according to the present invention can also be used in Peltier effect thermoelectric applications, for example in applications such as cooling (such as cooling of electronic components and devices, food and beverage refrigeration, atmospheric conditioning such as air conditioning and dehumidifiers, personal cooling devices carried by individuals in hot climates, respiration gas conditioning, and the like, and heating applications analogous to those already mentioned (for example, as an air heater in a vehicle, or a de-icer on an airplane). A device may be used for both Peltier and Seebeck effect applications within a vehicle, for example to provide electrical energy from thermal gradients, and for air conditioning. A unitary device may include a Seebeck effect device designed to provide electricity from thermal gradient, and to provide cooling or heating of an air flow to a passenger compartment.

Nanostructured semiconductor networks prepared using methods according to the present invention can also be used in other applications, such as light-emitting diodes, lasers, optical and IR detectors, transistors such as field-effect detectors, static electric field detectors, resonant tunneling diodes, photonic bandgap structures, optical waveguides, optical couplers, chemical sensors, and the like. Nanostructured networks can be used to form photonic materials.

In a further approach, the matrix material can be removed after the nanostructured composite is formed, for example using hydrofluoric acid, to leave a nanostructured network comprising a semiconductor or other electrical conductor. Such nanostructures can also be used in applications described above. Carbon nanotubes and the like can also be used within a matrix material.

Hence, improved thermoelectric nanocomposites are described, for example comprising a ceramic matrix (such as a mesoporous silica matrix), and a network of nanostructured semiconductor or nanostructured metal extending through the matrix. Nanostructured semiconductors include nanowires and nanoparticles. Diameters of the semiconductor nanowires may be less than 100 nanometers, such as less than 10 nanometers, providing significant quantum confinement effects that lead to a high value of the thermoelectric figure of merit ZT for the nanocomposite. A macroscopically electrically conducting nanostructured semiconductor network provides connective pathways for charge transport. The nanostructured semiconductor and ceramic components dramatically reduce thermal conductivity of the bulk composite material, due to the low thermal conductivity of the composite and phonon scattering at interfaces.

Improved fabrication methods allow thick devices to be formed which maintain a high temperature gradient with improves efficiency. The ceramic components also reduce the device cost and prevent sintering and/or domain growth of the semiconductor networks at high temperature, which provides the devices with long-term stability.

Potentially low-cost approaches to prepare the nanocomposite devices include template-assisted electrodeposition, in which an electrically conducting material, such as a semiconductor, is electrodeposited within a preformed mesoporous ceramic template, forming a nanocomposite with a nanowire networks through a ceramic matrix. Another method solidifies a mixture of semiconductor nanoparticles and ceramic particles at high temperature and pressure, forming a nanocomposite with continuous networks of semiconductor nanoparticles.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Patents, patent applications, or publications mentioned in this specification are incorporated herein by reference to the same extent as if each individual document was specifically and individually indicated to be incorporated by reference. In particular, U.S. Prov. App. Ser. No. 60/633,918 is incorporated herein in its entirety.

Having described our invention, we claim:

1. A thermoelectric device, comprising:
   a first electrical contact;
   a second electrical contact; and
   a bulk thermoelectric material located within an electrical path between the first electrical contact and the second electrical contact, the bulk thermoelectric material including:
   a first component being a semiconductor formed by consolidating particles into a continuous network,
   a second component being an electrically insulating inorganic oxide, the second component having an electrical conductivity substantially less than the first component,
   the thermoelectric material including the continuous network of the first component and a continuous network of the second component defining two bi-continuous interpenetrating networks.

2. The thermoelectric device of claim 1, the device providing an electrical potential between the first electrical contact and the second electrical contact when a thermal gradient extends over at least part of the device including the thermoelectric material.

3. A thermoelectric material comprising:
   a first component being a semiconductor formed by consolidating particles into a continuous network,
   a second component being an electrically insulating inorganic oxide, the second component having an electrical conductivity substantially less than the first component,
   the thermoelectric material forming a bulk thermoelectric material including the continuous network of the first component and a continuous network of the second component defining two bi-continuous interpenetrating networks.

4. The thermoelectric material of claim 3, wherein the thermoelectric material is a thick film or bulk material having a smallest physical dimension of greater than 1 mm.

5. The thermoelectric material of claim 3, wherein the electrical conductivity of the first component is over 100 times greater than the electrical conductivity of the second component.

6. The thermoelectric material of claim 3, wherein the continuous network of the first component is a three-dimensional continuous network.

7. The thermoelectric material of claim 3, wherein:
   the first component is chosen from the group consisting of tellurium-containing semiconductors, selenium-containing semiconductors, and silicon-germanium alloys; and the second component includes a material chosen from the group consisting of alumina, lanthanum cobaltate, sodium cobaltate, silica, tin oxide, zinc oxide, zirconium oxide, yttrium oxide, and titanium oxides.

8. The thermoelectric material of claim 3, wherein the first component includes bismuth telluride and the second component includes silica.

9. The thermoelectric material of claim 3, wherein the first component includes lead telluride and the second component includes titanium dioxide.

10. The thermoelectric material of claim 3, wherein a thermoelectric coefficient of the first component within the thermoelectric material is enhanced by a quantum size effect.

* * * * *

UNITED STATES PATENT AND TRADEMARK OFFICE
CERTIFICATE OF CORRECTION

PATENT NO. : 9,865,790 B2
APPLICATION NO. : 11/933584
DATED : January 9, 2018
INVENTOR(S) : Minjuan Zhang et al.

Page 1 of 1

It is certified that error appears in the above-identified patent and that said Letters Patent is hereby corrected as shown below:

In Column 5, Line 21, delete "lice" and insert --like--, therefor.

Signed and Sealed this
Twenty-second Day of May, 2018

Andrei Iancu
*Director of the United States Patent and Trademark Office*